United States Patent

Nieuwland et al.

(10) Patent No.: US 8,539,292 B2
(45) Date of Patent: Sep. 17, 2013

(54) TESTING OF AN INTEGRATED CIRCUIT THAT CONTAINS SECRET INFORMATION

(75) Inventors: André K. Nieuwland, Waarle (NL);
Sandeepkumar Goel, Eindhoven (NL);
Erik J. Marinissen, Eindhoven (NL);
Hubertus G. H. Vermeulen, Eindhoven (NL); Hendrikus P. E. Vranken, Weert (NL)

(73) Assignee: NXP B.V., Eindhoven (NL)

( * ) Notice: Subject to any disclaimer, the term of this patent is extended or adjusted under 35 U.S.C. 154(b) by 751 days.

(21) Appl. No.: 12/063,156

(22) PCT Filed: Aug. 9, 2006

(86) PCT No.: PCT/IB2006/052748
§ 371 (c)(1),
(2), (4) Date: May 12, 2010

(87) PCT Pub. No.: WO2007/017839
PCT Pub. Date: Feb. 15, 2007

(65) Prior Publication Data
US 2010/0223515 A1  Sep. 2, 2010

(30) Foreign Application Priority Data
Aug. 10, 2005 (EP) ..................................... 05107366
Aug. 9, 2006 (WO) .................. PCT/IB2006/052748

(51) Int. Cl.
*G01R 31/28* (2006.01)
*G06F 11/00* (2006.01)

(52) U.S. Cl.
USPC ......................................... 714/729; 714/733

(58) Field of Classification Search
None
See application file for complete search history.

(56) References Cited

U.S. PATENT DOCUMENTS

| 5,357,572 | A | 10/1994 | Bianco et al. | |
| 6,442,721 | B2* | 8/2002 | Whetsel | 714/726 |
| 7,334,173 | B2* | 2/2008 | Morgan et al. | 714/726 |
| 7,353,470 | B2* | 4/2008 | Cooke et al. | 716/136 |
| 7,634,701 | B2* | 12/2009 | Morgan et al. | 714/726 |

(Continued)

FOREIGN PATENT DOCUMENTS

| EP | 1089083 A1 | 4/2001 |
| WO | 20050029105 A1 | 3/2005 |

OTHER PUBLICATIONS

Lee, J.; Tehranipoor, M.; Patel, C.; Plusquellic, J.; , "Securing Scan Design Using Lock and Key Technique," Defect and Fault Tolerance in VLSI Systems, 2005. DFT 2005. 20th IEEE International Symposium on , vol., No., pp. 51-62, 5-5 Oct. 2005.*

Hely, D; et al "Scan Design and Secure Chip" 10th International On-Line Testing Symposium (IOLTS), Jul. 2004, pp. 219-224.

*Primary Examiner* — Daniel McMahon

(57) ABSTRACT

An integrated circuit comprises a scan chain with parallel inputs and outputs coupled to a functional circuit. A scan chain modifying circuit is provided coupled to the scan chain. When testing is authorized the scan chain modifying circuit operates in a mode wherein a normal shift path is provided through the scan chain. When testing is not authorized the scan chain modifying circuit operates to effect spontaneous dynamic changes in the shift path, which dynamically vary the length of the shift path between external terminals of the integrated circuit while shifting takes place. In an embodiment the dynamical variations are controlled by a running key comparison. In other embodiments running key comparison is used to disable transfer through the scan chain or operation of functional circuits.

16 Claims, 10 Drawing Sheets

(56) References Cited

U.S. PATENT DOCUMENTS

Figure 1:
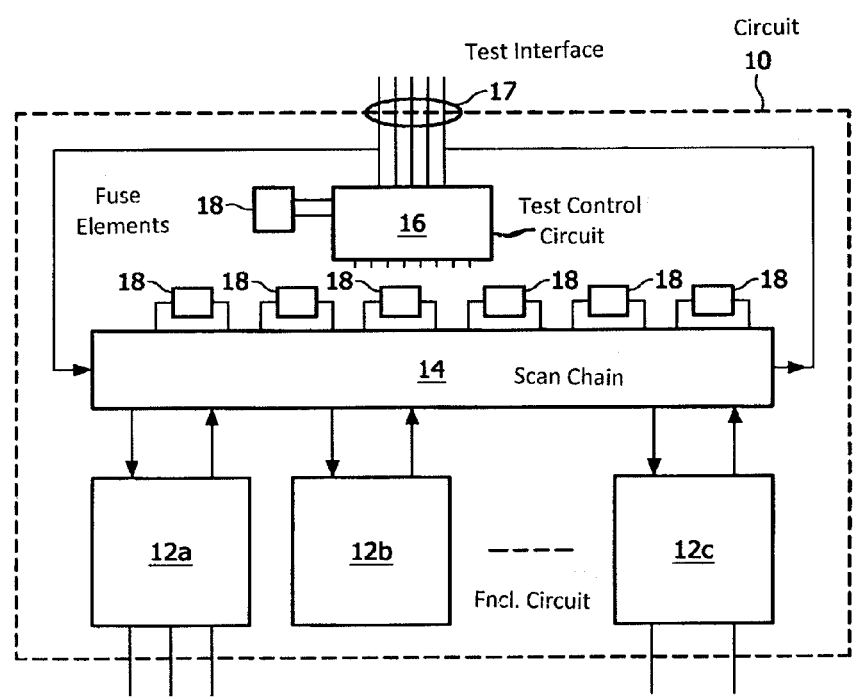

| | | |
|---|---|---|
| 7,660,968 B2 * | 2/2010 | Alfano et al. .................. 712/38 |
| 7,712,001 B2 * | 5/2010 | Hidaka et al. ................. 714/726 |
| 7,890,753 B2 * | 2/2011 | Dahan et al. .................. 713/164 |
| 2003/0140244 A1 * | 7/2003 | Dahan et al. .................. 713/200 |
| 2003/0204801 A1 | 10/2003 | Tkacik et al. |
| 2004/0133832 A1 | 7/2004 | Williams et al. |
| 2007/0022341 A1 * | 1/2007 | Morgan et al. ................ 714/726 |

* cited by examiner

TESTING OF AN INTEGRATED CIRCUIT THAT CONTAINS SECRET INFORMATION

The invention relates to testing of integrated circuits, and in particular of integrated circuits that contain secret information that must be protected against unauthorized access.

Testability and secrecy impose conflicting design requirements on integrated circuits. Testability requires that each circuit element should be coupled to a scan chain in such a way that expected faults in the circuit element show up in response signals from the circuit element that are captured into the scan chain in response to test stimuli from the scan chain. Thus the integrated circuit can easily be tested by using the scan chain to apply test stimuli and shift out test responses. Unfortunately, this also means that signals affected by secret information in the circuit elements can easily be accessed through the scan chain.

On the other hand secrecy can be achieved with a construction of the circuit wherein circuit parts with secret information do not affect the captured responses of the scan chain in any way. This limits the possibility to test these circuits to observation of functional responses of the entire circuit under normal functional conditions. In this way it is not possible to give a guarantee that the circuit will operate properly under all circumstances, or only after protracted and therefore expensive testing.

This problem is addressed in an article titled "Scan Design and Secure Chip", by D. Hely, M-L. Flottes, F. Bancel, B. Rouzeyre, N. Bérard and M. Renovell, published in the 10th International On-Line Testing Symposium (IOLTS) July 2004, pages 219-224. Hely et al. propose to permute the sequence in which scan cells appear in a scan chain as a function of time if an appropriate key has not been provided, or if a test disable fuse has been blown. In this way some testing is still possible, but relevant data cannot be reconstructed from the permuted output of the scan chain.

European Patent Application No. 1089083, likewise, describes a method of making the output of a scan chain useless for reverse engineering. Herein, test output data is encrypted unless an appropriate key has been received.

Apart from the cloaking effect on test data, these techniques may also make it more difficult to identify the external terminals of the integrated circuit that connect to the scan chain. During shifting other terminals will respond to the test data as well, through functional logic circuits. Because of the permutation the test data output cannot easily be determined by matching test input data with output data.

However, this is only a possible unintended side effect of these publications. No systematic effort is made to make it difficult to identify scan chain inputs and outputs. In practice it will generally still be possible to identify scan chain inputs and outputs.

Among others it is an object of the invention to make it more difficult to identify external scan chain input and output terminals of an integrated circuit.

The invention provides for an integrated circuit according to claim 1. In this integrated circuit a scan chain modifying circuit varies routing of test data through a scan chain as inherent part of the shifting process. The scan chain modifying circuit varies the number of times the test data traverses a scan cell on the journey through the scan chain between the external terminals. Thus some part of the test data passes this scan cell more often than another part of the test data while both parts of the test data are shifted through the scan chain. This makes it more difficult to identify the scan chain.

In one embodiment the variable routing is disabled when a predetermined key is supplied to the integrated circuit or until one or more (anti-) fuses have been blown. Thus, normal testing is possible when the key is supplied or the fuse has not yet been blown. If no key is supplied, or after the one or more (anti-)fuses have been blown, the variable routing is enabled so that shifting of a vector of test data has the effect that some parts of the vector pass a scan cell more often than other parts. In an alternative embodiment the variable routing is also used during normal testing. In this case adaptations are made to the test vector and/or to expected test results to account for the variable routing, and/or time dependent changes are made to the external terminals to which the test vector is applied, or test results are received to account for the variable routing.

In an embodiment a feedback loop is temporarily created in the scan chain during shifting. Thus, only some of the test data passes through the feedback loop, whereby it returns to scan cells that it has already passed through. In another embodiment a bypass is temporarily created along the scan chain, so that some of the test data does not pass through the scan cell and other test data does. Thus, the length of the scan chain varies as a function of time during shifting, making it more difficult to identify which is external terminals form the input and output of a scan chain. In yet another embodiment a change is made in the connections of the scan chain to the external terminals of the integrated circuit so that some test data passes through the scan cell to one external terminal and other test data passes through the scan cell to another external terminal, making it more difficult to identify which external terminals form the input and output of a scan chain. In a further embodiment a plurality of scan chains is used, coupled between respective pairs of external terminals of the integrated circuit, and time varying cross connections are made between different scan chains. Thus, it is difficult to determine when which external terminals are connected to the scan chains and no test data is lost.

In an alternative embodiment running key comparison is used to generate a control signal to maintain a predetermined path through the scan chain and/or to enable/disable transfer through the scan chain and/or to enable/disable operation of functional circuits. Thus, very long keys can be used without unduly increasing test time or delay before operation, because key verification can proceed while testing or operation takes place.

These and other objects and advantageous aspects of the invention will become apparent from the description of non-limitative embodiments using the following figures.

Figure 2:
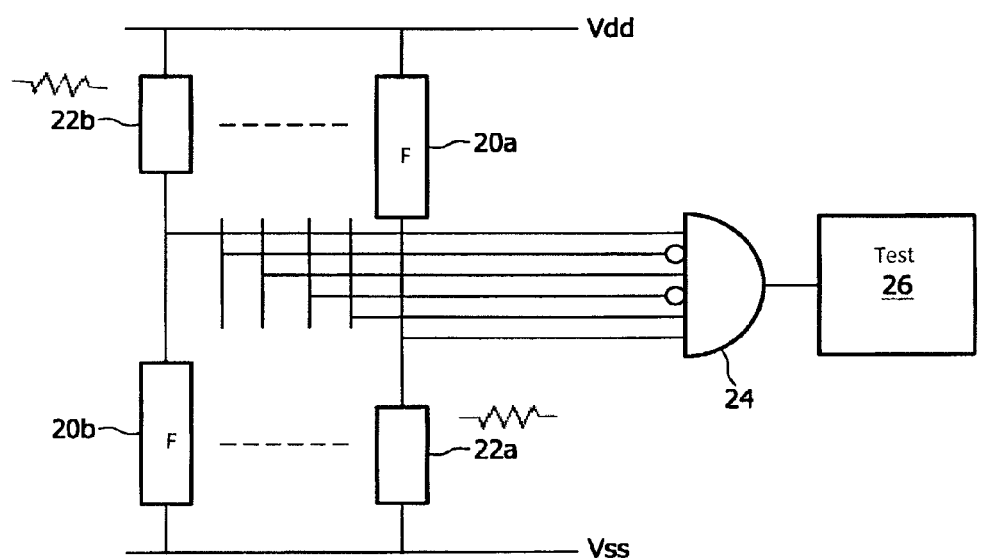
Figure 2A:
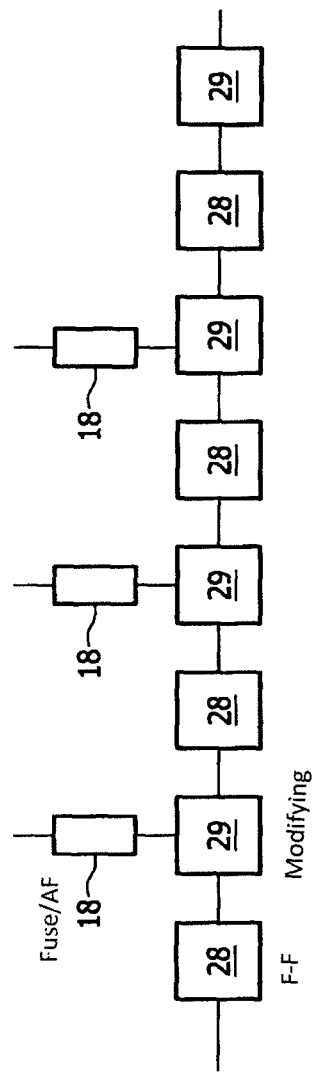
Figure 2B:
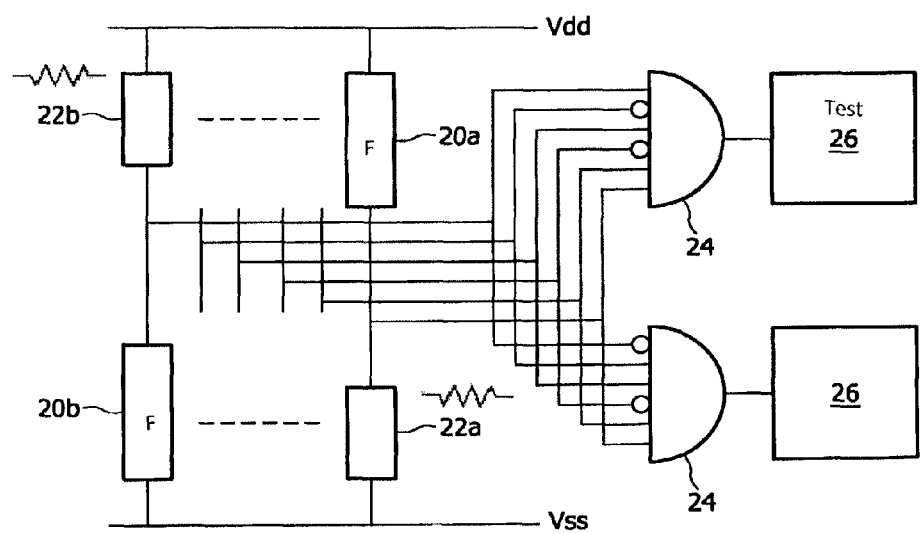
Figure 3:
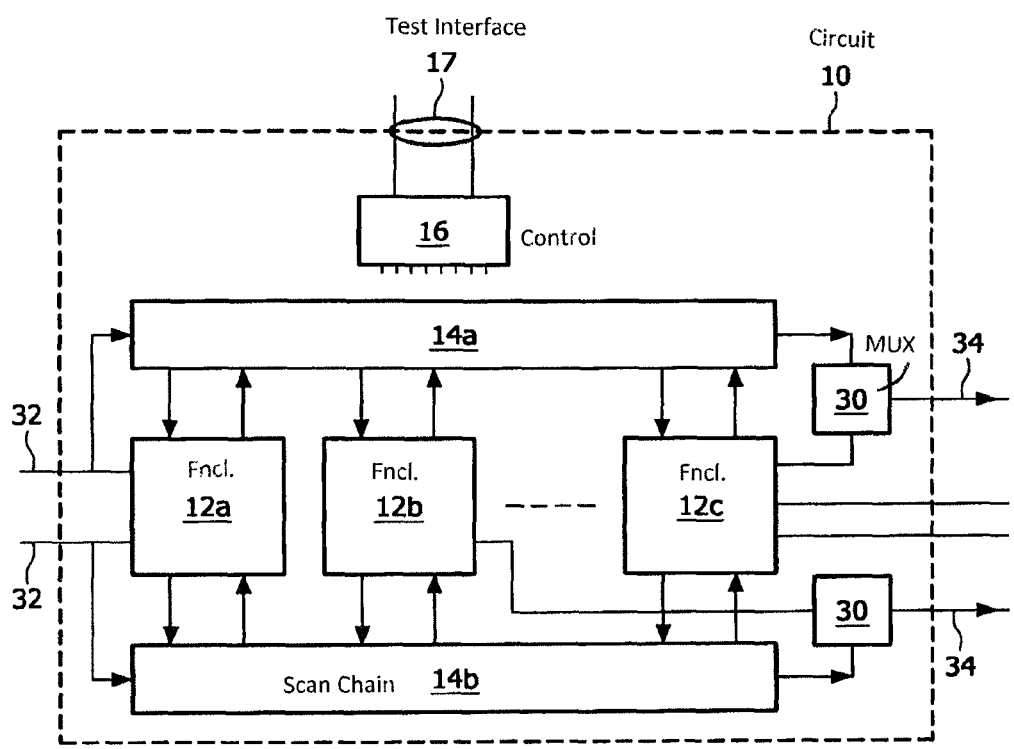
Figure 4:
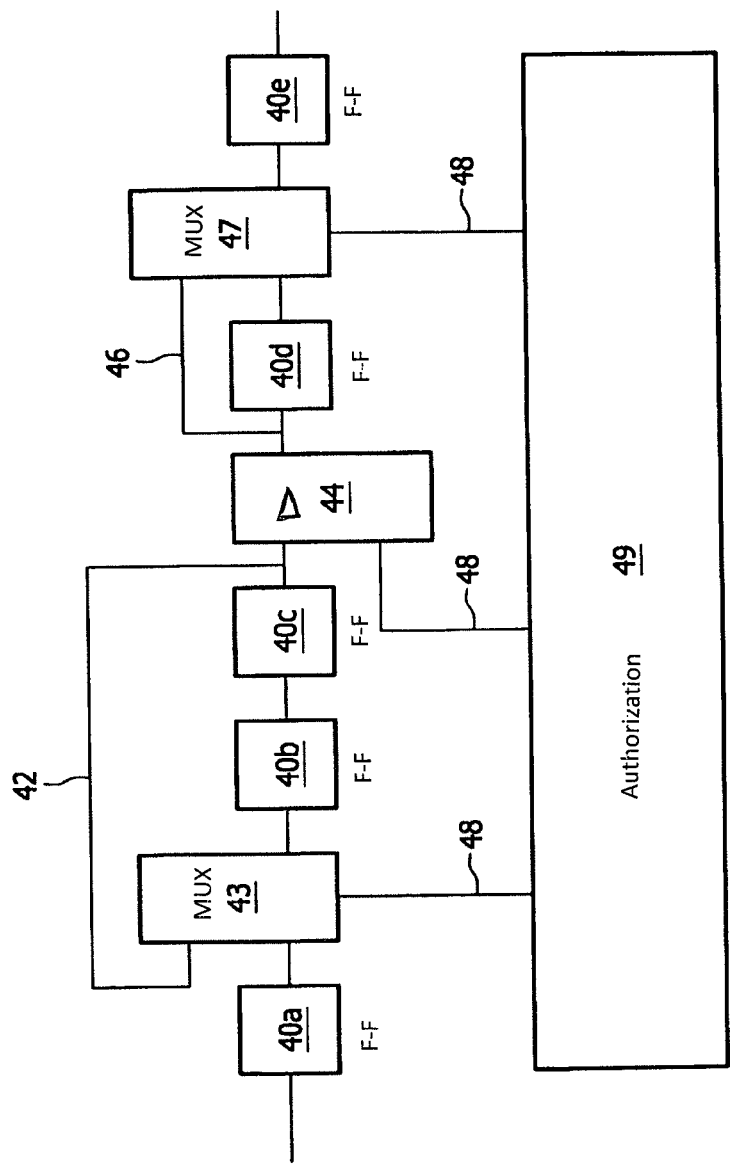
Figure 5:
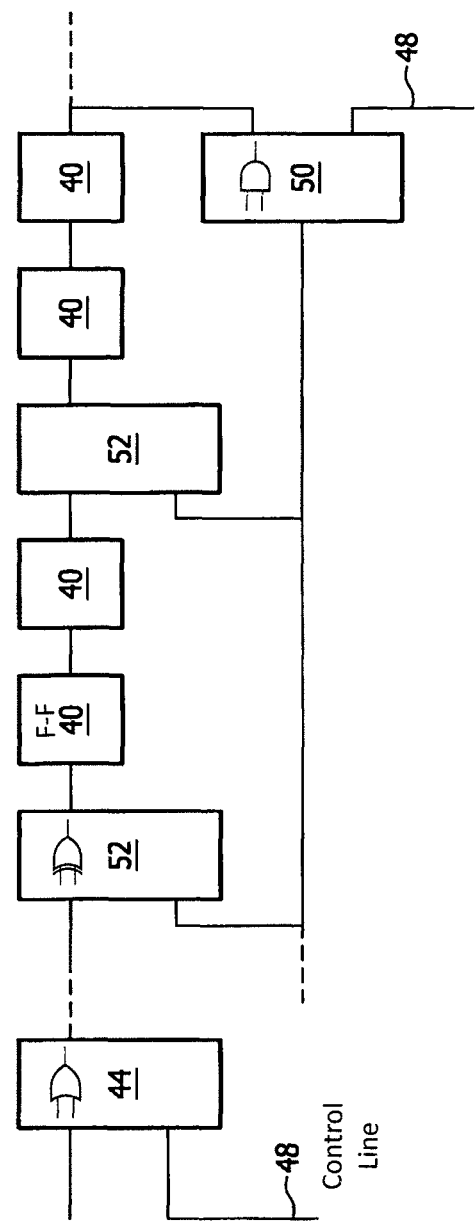
Figure 6:
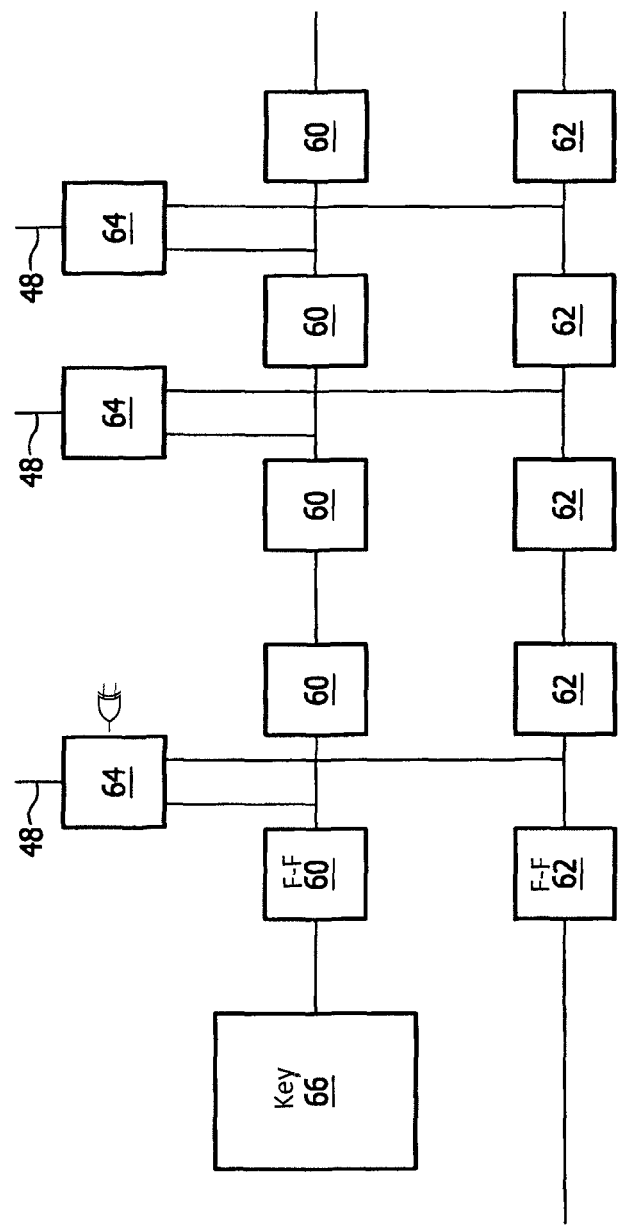
Figure 6A:
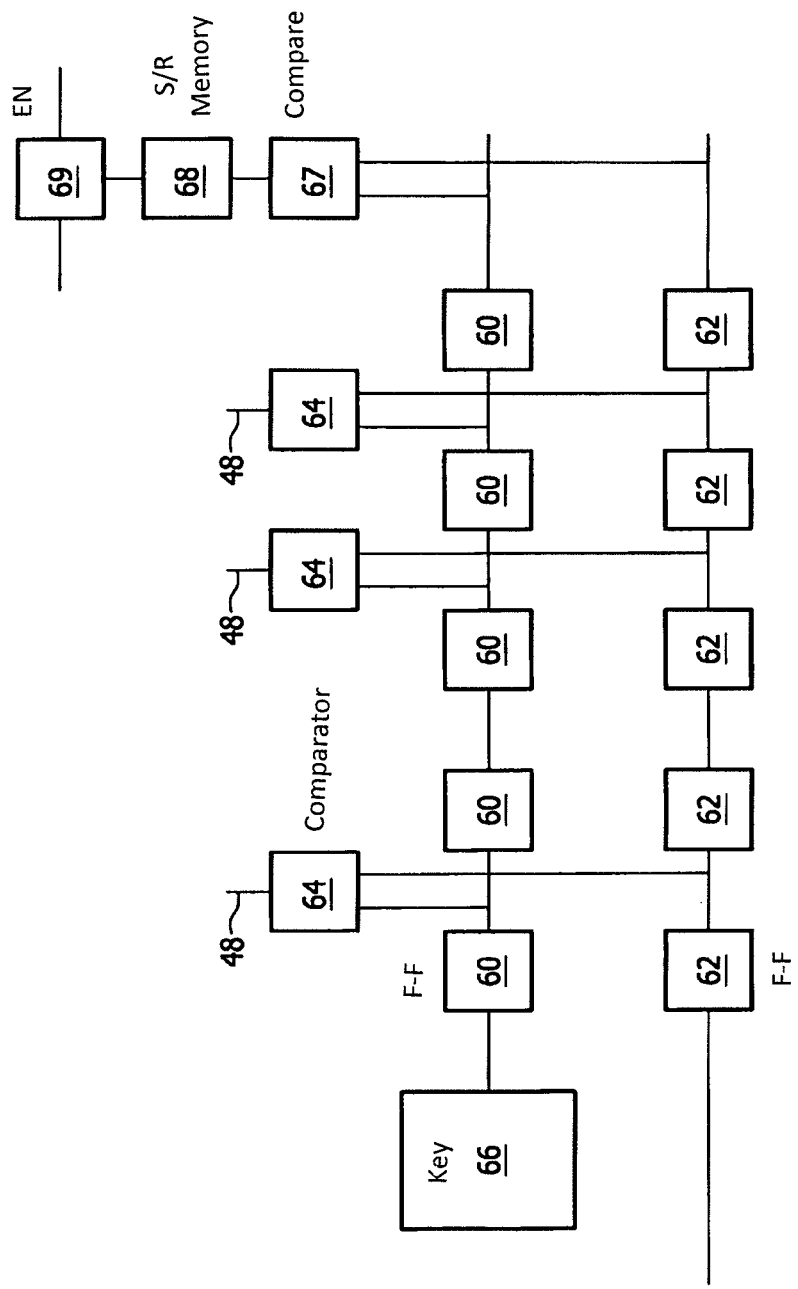
Figure 7:
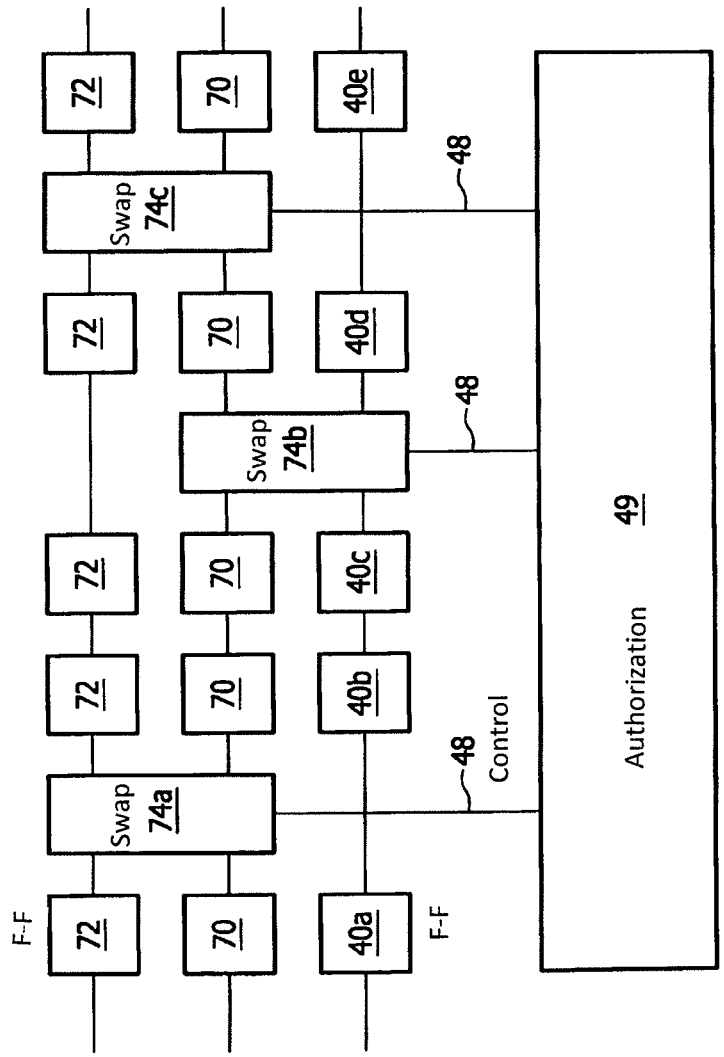

FIG. 1 shows an integrated circuit with fuses to protect access to circuits via a scan chain FIG. 2 shows control of a scan function by means of a plurality of fuses FIG. 2a shows a scan chain FIG. 2b shows control of a scan function by means of a plurality of fuses FIG. 3 shows a circuit wherein test terminals are multiplexed with functional terminals FIG. 4 shows a scan chain FIG. 5 shows a scan chain FIG. 6 shows an authorization control circuit FIG. 6a shows a further application of an authorization control circuit FIG. 7 shows a plurality of parallel scan chains FIG. 1 shows an integrated circuit 10 comprising functional circuits 12a-c, a scan chain 14, a test control circuit 16 and fuse elements 18. Test control circuit 16 has inputs coupled to an external test interface 17 and control outputs (connections not shown) coupled to scan chain 14. Scan chain 14 has an input coupled to a test data input of external test interface 17 and an output coupled to a test data output of external test interface 17. Fuse elements 18 are coupled to test control circuit 16 and scan-chain 14. Scan chain 14 is coupled to inputs and outputs of functional logic functional circuits 12a-c. Although single input and output lines are shown between functional circuits 12a-c and scan chain 14, it should be appreciated that in practice many such lines may be provided in parallel.

It should be emphasized that the figure has been limited to aspects of the integrated circuit that serve to explain the use of fuse elements 18. An arbitrary number of functional circuits 12a-c has been shown, with arbitrary external connections. In practice many additional test-features may be present, such as a boundary scan chain coupled between the integrated circuit-external inputs and outputs of functional circuits 12a-c, a plurality of parallel scan chains coupled between the same test data input and output, shared use of terminals of integrated circuit 10 for input/output of functional circuit and test interface 17, etc.

At least one of functional circuits 12a-c contains "secret" information, i.e. information that should not leave integrated circuit 10. Typically this information is a cryptographic key or an identity code, which may be stored in a non-volatile memory in the relevant functional circuit 12a-c, or otherwise programmed in this functional circuit 12a-c, or defined by circuits that have been implemented in the functional circuit 12a-c. Typically, each manufactured integrated circuit has its own unique secret information, but alternatively the secret information may be the same for every integrated circuit of a class.

In operation, the circuit can be switched between a normal functional mode and a test mode. In the normal functional mode flip-flops from scan chain 14 serve as flip-flops that are coupled between inputs and outputs of functional circuits 12a-c. In the test mode the inputs of flip-flops in the scan chain are coupled to the outputs of other flip-flops in the scan chain, so that a serial shift register is formed.

When a number of the fuse elements 18 has been blown, the integrated circuit can be tested by a conventional scan test protocol in the test mode. In one example of such a protocol the circuit first enters a shift mode of operation wherein the flip-flops of the scan chain are coupled in series and test stimuli from the test data input are serially shifted through scan chain 14, from where they are applied to inputs of functional circuits 12a-c. Subsequently the circuit enters a capture mode wherein the inputs of flip-flops of the scan chain 14 are coupled to the outputs of functional circuits 12a-c so that these flip-flops capture test responses from functional circuits 12a-c. After this the circuit returns to a shift mode wherein the flip-flops of scan chain 14 once more form a shift register and scan chain 14 shifts captured data to the test data output out of integrated circuit 10.

Different ones of the fuse elements 18 serve to enable and disable conventional test operation respectively when not blown. Fuse elements 18 may be connected to test control circuit 16 to enable or disable switching between the different modes of operation during testing. In one example, fuse elements 18 are arranged to disable switching to the capture mode. In another example may be fuse elements 18 are arranged to disable or enable supply of a test clock to circuits from scan chain 14 and/or to test control circuit 16. Fuse elements 18 may coupled to scan chain 14 to enable or disable normal shifting, e.g. by blocking or establishing a shift path through scan chain 14, or by bypassing part of scan chain 14.

Fuse elements can be fuses and/or anti-fuses. A fuse/anti-fuse, as used herein, is an electrical connection that can be made to a assume a state that is provides a conductive/non-conductive (blown) connection in such a way that physical repair, such as deposition of conductive material, is needed to restore the situation before blowing. Blowing may be achieved for example by applying a high voltage across the fuse/anti-fuse or by heating the fuse/anti-fuse, for example with a laser beam or electrically.

FIG. 2 shows a circuit with a plurality of fuses 20a-b. The circuit comprises a plurality of series arrangements of a fuse 20a-b and a resistive element 22a-b coupled between power supply connections Vdd, Vss. Although only two series arrangements are shown, it should be realized that any number may be present. The circuit comprises an AND gate 24 with inputs coupled to nodes in respective ones of the series arrangements between the fuse 20a-b and the resistive element 22a-b. Some of the inputs of AND gate 24 are inverting and others are non-inverting. AND gate 24 has an output coupled to an enable/disable control input of a test circuit 26. Test circuit 26 is constructed so that it disables normal test operation when it receives a logic low enable/disable control signal and that it enables normal test operation when it receives a logic high enable/disable control signal. Test circuit 26 may be a circuit that enables switching to the capture mode, supplying of test clock signals, passing of test data through a connection scan chain 14, etc.

In part of the series arrangements, the fuse 20a-b of the series arrangement couples the node to one of the power supply connections Vdd, Vss. In the remaining series connections the fuse 20a-b couples the node to the other one of the power supply connections Vdd, Vss. Hence normal test operation is enabled only if fuses 20a-b with connections of a first type are not intact and fuses with connections of a second type are intact. Herein the fuses 20a-b with connections of the first type are fuses 20a-b that are connected to the higher power supply connection Vdd and a non-inverting input of AND gate 24 and fuses 20a-b that are connected to the lower power supply connection Vss and an inverting input of AND gate 24. Conversely fuses 20a-b with connections of the second type are fuses 20a-b that are connected to the lower power supply connection Vss and a non-inverting input of AND gate 24 and fuses 20a-b that are connected to the higher power supply connection Vdd and an inverting input of AND gate 24.

Instead of part or all of fuses 20a-b anti-fuses may be used. Fuses and anti-fuses will commonly be referred to as fuse elements. Fuse elements are anti-fuses can similarly be distinguished into a first and second type, according to whether they must be blown before testing or not. Anti-fuses 20a-b with connections of the first type are anti-fuses 20a-b that are connected to the higher power supply connection Vdd and an inverting input of AND gate 24 and anti-fuses 20a-b that are connected to the lower power supply connection Vss and a non-inverting input of AND gate 24. Conversely anti-fuses 20a-b with connections of the second type are anti-fuses 20a-b that are connected to the lower power supply connection Vss and an inverting input of AND gate 24 and anti-fuses 20a-b that are connected to the higher power supply connection Vdd and a non-inverting input of AND gate 24.

After manufacture of integrated circuit 10 all fuse elements 20a-b are intact. Before testing fuse elements 20a-b with connections of the second type are blown, but the fuse elements with connections of the first type are not blown. The integrated circuit is then ready for testing. After testing at least part of the fuse elements 20a-b with connections of the first type are blown as well.

As a result, a person that does not know whether a fuse element has a connection of the first type or second type is not able to predict which of the blown fuse elements should be repaired and which not, in order to re-enable testing. As will be appreciated determination of the type of fuse element is made more difficult by connecting the fuse elements so that the voltages at their terminals do not provide any information about the type of fuse element. In the example of the figure, this is realized by using inverting and non-inverting inputs of the AND gate for fuse elements that produce a high logic level input signal when blown and/or by using inverting and non-inverting inputs of the AND gate for fuse elements that produce a low logic level input signal when blown. A inverting input may be realized by including an chain of an odd number of inverting circuits between a fuse element and an input of the AND gate (or other multi-input logic circuit). A non-inverting input may be realized by including an chain of an even number of inverting circuits or no inverting circuits between a fuse element and an input of the AND gate (or other multi-input logic circuit). By using an even number greater than zero it is made more difficult to distinguish fuses of the first and second type.

As will be appreciated determination of the type of connection can be made difficult for example by placing a part of the integrated circuit that contains AND gate 24 and its inverting/non-inverting inputs under a covering layer that can not easily be removed without destroying the circuit, by distributing the AND gate over different areas of the integrated circuit, etc.

As will be appreciated AND gate 24 with inverting and non-inverting inputs is only one example of a circuit with this effect. Any other circuit may be used that enables testing only when one predetermined combination or one of a few combinations of fuses 20*a-b* is intact and others are not intact. Also, of course instead of at least part of fuses 20*a-b* may be connected so that they do not affect testing. This also makes it more difficult to identify the fuses that must be restored.

It is not necessary to use a circuit that combines the effect of the fuses into one signal, as is the case in FIG. 2. Alternatively, circuits may be used wherein different fuses have effects at different places in the test circuit, but so that their combined effect allows sensible testing only if the appropriate combination of fuses has been blown/not blown. This has the advantage that the circuit is less vulnerable to local tampering. To prevent repair, testing should be allowed only in a configuration wherein the fuses that affect the scan chain at predetermined first places have been blown and fuses that affect the scan chain at predetermined second places have not been blown. Instead of ro an individual fuse for each place along the scan chain, groups of fuses may be used. A circuit like that of FIG. 2 may be used to realize this for example.

FIG. 2*a* shows an example wherein a scan chain, with scan flip-flops 28 contains modifying circuits 29 coupled to respective fuse elements 18. In this circuit each modifying circuit 29 is arranged to affect test data that flows through the scan chain in a first way if its corresponding fuse/anti-fuse 18 is not blown and in a second way if the corresponding fuse/anti-fuse 18 is blown. The combination of modifying circuits 29 is selected so that their combined effect results no modification if only a selected combination of fuses is blown.

Modifying circuits 29 may for example forward unmodified data if the fuse/anti-fuse 18 is blown and exclusive OR results of successive test data bits with a time dependent pseudo-random sequence if the fuse/anti-fuse 18 is not blown. In this case, the pseudo-random sequences of a different modifying circuit 29 may be time shifted versions of each other by amount corresponding to their distance in the scan chain, so that their combined effect is to leave data unmodified after it has been shifted through both modifying circuits 29. In a more complicated embodiment different pseudo random sequences may be used for different modifying circuits 29, selected so that their time shifted exclusive OR is always zero. Thus, their combined effect is to leave data unmodified after it has been shifted through both modifying circuits 29. In another embodiment different flip-flops may be used in parallel at different stages of the scan chain, so that along part of the scan chain parallel branches are available. In this embodiment modifying circuits 29 switch data between different branches, so that the data propagates beyond the parallel branches only if the appropriate combination of switches is made.

FIG. 2*b* shows an example of a circuit that can be used to enable operation in different states. A plurality of AND gates 24 is provided, each for enabling operation in a different state, wherein the AND gate enables a scan chain (not shown) to access a different set of one or more functional circuits (not shown) that contain secret information. As can be seen, the AND gates at least partly receive signals from the same (anti-) fuses. Preferably, the connections to the AND gates are arranged so that first a selection of (anti-) to fuses must be blown to create an enabling signal from a first AND gate and subsequently additional (anti-)fuses must be blown that create an enabling signal from a second AND gate, thereby at the same time disabling the first AND gate.

Thus, there are three classes of (anti-) fuses. The first AND gate is connected to all three classes so that it outputs a logic one if only the (anti-) fuses of the first class are blown, the second AND gate is connected to all three classes so that it outputs a logic one if only the (anti-) fuses of the class first and second class are blown. It should be appreciated that more than two AND gates may be used in this way, defining increasingly large sets of anti-fuses that must be blown.

As has been noted for FIG. 2, the AND gates and the particular connections are shown merely for illustrative purposes. Other circuits with the same effect on test access may be used. Furthermore, although signals from all (anti-)fuses are coupled to both AND gates 24, it should be appreciated that this is not necessary.

Although embodiments have been shown wherein test access to circuits with secret information is enabled and disabled as a whole, it should be appreciated that this is not necessary. Instead, the integrated circuit may provide for a plurality of different states, in each of which test access is possible only to a respective part of the secret information (the respective parts for different states being different, although overlaps are not excluded). In this case the integrated circuit is preferably set to successive ones of these states during testing, each time by blowing an additional number of fuses or anti-fuses. Preferably, the same (anti-) fuses are used to enable operation in different states.

FIG. 3 shows an integrated circuit that has external connections 32, 34 that are multiplexed as test data inputs/outputs and as input/outputs of functional circuits 12*a-b*. Multiplexers 30 are provided at the multiplexed outputs of integrated circuit 10. Each multiplexer 30 has a first input coupled to an output of a functional circuit 12*a-c* and a second input coupled to an output of a scan chain 14*a,b*. An output of the multiplexer 30 is coupled to an external terminal 34 of integrated circuit 10. A control input (not shown) of the multiplexer 30 is coupled to test control circuit 16. A number of input terminals is coupled in parallel to an input of a functional circuit 12*a-c* and an input of a scan chain. In addition, terminals 32 may be used that can be switched to function alternately as input and output. It should be understood that the multiplexed inputs 32 and outputs 34 are shown only by way of example. In practice a far greater number of terminals may be present, some or all of which may be multiplexed as test inputs and outputs.

A plurality of scan chains 14*a*-*b* is shown. For the sake of completeness each functional circuit 12*a*-*b* is shown coupled to all scan chains 14*a*-*b*, although of course preferably each functional circuit 12*a*-*b* has inputs and outputs coupled to one of the scan chains only.

Preferably, the integrated circuit is construed to make it difficult to determine to which of the external terminals of integrated circuit the inputs and/or outputs of scan chains 14*a*-*d* are coupled. This is done by avoiding a one-to-one relation between test data that is shifted in at a test input and test data that is shifted out at a test output, at least when test is not authorized, for example because the correct sets of fuse elements (not shown) are not intact/blown respectively or when an appropriate key has been provided. Various circuits can be used to conceal the test data input/outputs.

FIG. 4 shows part of a scan chain with scan flip-flops 40*a*-*e* shown from left to right in a nominal sequence wherein test data is shifted through the scan chain. Only the connections that are used for shifting are shown. It should be understood for the scan chain of the present and following figures that all or most of the scan flip-flops 40*a*-*e* have an output coupled to an input of a functional circuit (not shown) and/or a functional input (not shown) coupled to an output of a functional circuit (not shown) as well as a control input (not shown) coupled to the test control circuit, to control whether data is loaded from the functional circuit or from a preceding scan flip-flop 40*a*-*e* in the scan chain.

A loop 42, a bypass 46 and a logic gate 44 have been added to the scan chain. A loop multiplexer 43 is provided with a first input coupled to the output of a first scan flip-flop 40*a* of the scan chain and an output coupled to the input of a second scan flip-flop 40*b* that adjacent to the first scan flip-flop 40*a* in the nominal sequence of the scan chain. A second input of loop multiplexer 43 is coupled to an output of a third scan flip-flop 40*c* that follows the second scan flip-flop 40*b* in the nominal sequence. A bypass multiplexer 47 is provided with a first input coupled to the output of a fourth scan flip-flop 40*d* of the scan chain and an output coupled to the input of a fifth scan flip-flop 40*e* that adjacent to the fourth scan flip-flop 40*d* in the nominal sequence of the scan chain. A second input of loop multiplexer 43 is coupled to an output of a scan flip-flop 40*c* that precedes the fourth scan flip-flop 40*d* in the nominal sequence. An OR gate 44 is provided with a first input and an output coupled to the output and input to nominally successive flip-flops 40*c*-*d* in the scan chain respectively.

An authorization control circuit 49 has control lines 48 coupled to control inputs of loop multiplexer 43 and bypass multiplexer 47 and to a second input of OR gate 44.

In operation, authorization control circuit 49 detects whether test is not authorized, for example because the correct sets of fuse elements (not shown) are not intact/blown respectively, or when an appropriate key has been provided. When authorization control circuit 49 detects that the test is authorized authorization control circuit 49 applies steady signals to control lines 48, with a logic level so that loop multiplexer 43, OR gate 44 and bypass multiplexer 47 pass test data from scan flip-flops 40*a*-*e* for normal sequential shifting.

When authorization control circuit 49 detects that the test is not authorized authorization control circuit 49 applies time varying signals to the control lines (for example random or pseudo-random signals) to control lines 48. As a result loop multiplexer 43 will at times cause test data to be looped back, effectively lengthening the scan chain; bypass multiplexer 47 will at times cause the scan chain to shorten and OR gate 44 will at times overwrite test data with a logic one. In this way signal variations that are responsive to to test data pass through the scan chain, but there is no longer a one to one relationship between the stream of test data at the input and the output. While data is shifted through the scan chain outputs of functional circuits 12*a*-*c* that are connected to external terminals of the integrated circuit and that are responsive to the data in the scan chain remain connected to the external terminals, so that the shifting of data through the test chain causes signal variations at these external terminals. This makes it difficult to distinguish the external terminal of the integrated circuit that carries the output signal from the other external terminals, for example terminals that are coupled to outputs of functional circuits 12*a*-*c* which will also produce signal variations in response to the test data.

It should be appreciated that the configuration of a loop multiplexer 43, bypass multiplexer 47 and OR gate 44 and their connections are shown merely by way of example. In practice loops and bypasses involving a different number of scan flip-flops may be used, loops and/or bypasses may overlap. Logic gates may be used at any position in the scan chain, other types of logic gates such as AND gates or XOR (exclusive OR) gates may be used and more than one logic gate may be provided. Preferably a combination of loops, bypasses and logic gates is used, because this makes it harder to reconstruct the structure of the scan chain.

FIG. 5 shows a part of a scan chain wherein a more complicated loop has been added. In this embodiment a Linear Feedback Shift Register (LFSR) is formed when the authorization control circuit (not shown) supplies an appropriate control signal. A plurality of XOR gates 52 has been provided in the scan chain before some of scan flip-flops 40. An AND gate 50 has been provided to feed back signals from a scan flip-flop 40 to inputs of the XOR gates if a corresponding control signal is received on control line 48 form the authorization control circuit (not shown). It should be appreciated that, only an example of an LFSR is shown, other LFSR with XOR's at more and/or different places along the scan chain may be used. Preferably an LFSR is used that is able to produce repeating sequences with a long repetition period in response to logic pulses at the feedback. Examples of connections for producing long to sequences are known from the LFSR art. It may also be noted that it suffices authorization control circuit (not shown) keeps the feedback switched on while no authorization is detected: it is not necessary to switch the feedback on and off. Preferably, the LFSR is preceded by a part of the scan chain that contains one or more logic gates, like OR gate 44 or a XOR gate, that are arranged to create logic signal variations in the data that is shifted through the scan chain, even if test data containing only logic zero's or only logic ones is supplied. In this case the LFSR will respond to the logic ones by generating more extensive pseudo-random patterns.

FIG. 6 shows part of an embodiment of an authorization control circuit. The authorization control circuit contains a key generator circuit 66, a first shift register with first flip-flops 60, a second shift register with second flip-flops 62 and XOR gates 64 (exclusive OR gates). Key generator circuit 66 has an output coupled to an input of the first shift register. The second shift register has an input coupled to an external terminal of the integrated circuit. XOR gates 64 each have inputs coupled to a respective pair of a first and second flip-flop 60, 62, and an output coupled to a control line 48. Control lines are coupled to scan chain for example as shown in FIG. 4. Although relatively short first and second shift registers are shown, it should be understood that much longer shift register may be used to which, and/or more XOR gates may be connected to generate additional control signals.

In operation, key generator circuit 66 (e.g. a pseudo random generator) outputs successive bits of a key to the first shift register. Bits from an external input are shifted through the second shift register. XOR gates 64 compare corresponding bits from the first and second shift register. If the bits from the first and second shift register match, XOR gates 64 supply signals to control lines 48 that make a scan chain operate normally, suppressing feedback, and/or bypass and/or overwriting of test data. If the bits from the first and second shift register don't match time dependent signals will arise on control line, which cause the scan chain to deviate from normal shift operation.

Preferably, the first and second shift register are clocked with the same clock as the scan chain (not shown) that is controlled by the authorization control circuit. As one alternative, a divided down version of this clock may be used to clock the first and second shift register. By using the same or related clock signals the supply of matching new bits needs to continue during scan-shifting for testing. In this way very long running keys can be used, which makes it more difficult to get unauthorized access. In addition this automatically provides for time varying control signals for the scan chain, which make it difficult to identify the scan chain.

Although the use of only one shift register has been shown for shifting in the bits of the key, it should be understood that a plurality of shift registers may be used in parallel and/or that the control signals on control lines 48 may be generated as a result of comparing more than one bit of external key data and internal key data. The authorization control circuit may use a single key comparison to control a plurality of scan chains. Alternatively, a plurality of key comparisons may be used in parallel for different scan chains. As another alternative one key comparison circuit may be used to verify different keys for different scan chains.

As an alternative, conventional static key verification may be used in the authorization control circuit, or the first and second shift register may be prevented from shifting once a complete key has been loaded. In this case an external key is loaded into the authorization control circuit and the authorization control circuit detects whether this key is correct or not. When the authorization control circuit has found the key to be correct it sets the control signals on control lines 48 to make the scan chain function normally. If not the authorization control circuit feeds signals from a time dependent signal generator, such as a pseudo random generator or even a true random generator to control lines 48. This has the advantage that any key verification technique can be used, but it imposes a compromise between the length of the key and the overall time needed for testing.

FIG. 6a shows an embodiment wherein the structure with the first and second shift register can also be used to enable or disable access to a scan chain. The first and second shift register for shifting in key data and a key reference respectively, clocked by same or related clock signals. In this to embodiment a comparison circuit 67 and a set/reset memory circuit 68 are provided. The comparison circuit 67 has inputs coupled to the first and second shift register and an output to a set input of the set/reset memory circuit 68. The set/reset memory 68 circuit is configured so that it is reset on power up, or at a reset of the integrated circuit. The set/reset memory circuit 68 is coupled to an enable/disable control input of an enable circuit 69 in the scan chain (not shown). In operation the set/reset memory circuit 68 disables input to and/or output from the scan chain once the set/reset memory circuit 68 is set. The set/reset memory circuit 68 is set by comparator circuit 67 when a mismatch occurs between the key data and the reference data in the first and second shift register Preferably the set/reset memory circuit 68 is clocked (not shown) so that a "set" occurs only when a stable comparison result is available.

Preferably key comparison continues indefinitely and at least until after capture of test responses. Preferably the key generator produces a reference sequence that does not repeat at least during a period that is needed to shift data through the scan chain.

It may be noted that the structure with enable circuit 69 can be applied even if no further comparator circuits 64 are used, i.e. when no other changes are made to the scan chain. This embodiment provides for a running comparison of keys that continues while test data is shifted through the scan chain. In this way time is gained because the start of testing does not need to wait for the end of comparison. Thus very long keys can be used without incurring a long delay. It may also be noted that the structure could be used to enable circuits other than enable circuits in a scan chain (even without enabling enable circuits in the scan chain). Thus, for example a secure function of an integrated circuit could be disabled after a mismatch between the key and the reference. This has the advantage that it prevents unauthorized use of the integrated circuit and/or unauthorized access. However, an advantage of using enabling circuit in the scan chain is that normal test access need not be limited to prevent access to secret information.

FIG. 7 shows a circuit with first, second and third scan chain, each with a set of scan flip-flops 40a-e, 70, 72 coupled as a shift register. Each scan to chain is coupled to a different pair of external terminals of the integrated circuit for supplying test data to the integrated circuit and receiving test results from the integrated circuit. Swapping circuits 74a-c are coupled between the scan flip-flops of pairs of scan chains. Swapping circuits 74a-c each have two inputs and two outputs and are arranged to feed input signals from a first and second input either to a first and second output respectively, or cross-wise to the second and first output respectively, under control of control signals from authorization control circuit 49. Each swapping circuits 74a-c may be realized as a pair of multiplexers, with mutually opposite control, but other circuits are possible.

In operation, when authorization control circuit 49 authorizes testing, it makes swapping circuits 74a-c pass test data along the scan chains in parallel. When authorization control circuit 49 authorizes testing, it applies time varying control signal to swapping circuits 74a-c (e.g. a pseudo random signal) so that at times test data crosses from one scan chain to another, thus obscuring the which of the outputs of the scan chains correspond to which inputs.

Preferably, authorization control circuit 49 makes swapping circuits 74a-c pass test data along the scan chains in parallel when testing is authorized. However, this is not necessary. In an alternative embodiment authorization control circuit 49 makes swapping circuits 74a-c swap the connections between the scan chains in a predetermined time varying manner also when testing is authorized.

In effect, this means that the external terminals that are used as inputs and outputs of a scan chain change as a function of time during shifting. When this form of swapping is used when test data is shifted in, test data for testing from a specific scan chain will have to be applied to the integrated circuit in stretches of bits that are applied to the external terminals of different scan chains. Similarly when this form of swapping is used when test data is shifted out, test results from a specific scan chain will have to be gathered in stretches of bits that are collected from the external terminals of different scan chains. This makes it even more difficult to identify the scan chains.

The predetermined time varying manner of swapping the connections between the scan chains may be started for example in response to a reset signal, or in response to detection that a predetermined key has been supplied, after which a periodically repeated pattern of swapping is started. Thus, external test equipment can be synchronized to the predetermined time varying manner of swapping.

It may be noted that several scan chains can be used in parallel for shift in and shift out during testing. In this case the test data for different scan chains must be mixed together and test results for different scan chains must be collected.

Preferably, the authorization circuit is arranged to cause swapping both during shift in of test data and during shift out of test results. But alternatively, swapping may be enabled during shift in or shift out only. This still makes it difficult to identify the scan chains.

In its simplest form, swapping may be realized only by a swapping circuit between the output of a scan chain and the external terminals of the integrated circuit. Thus, a time varying connection of the output of the scan chain to different external terminals can be realized, making it more difficult to identify which external terminal should be used. However, use of "internal" swapping circuits between different parts of the scan chains has the additional advantage that the control over the functional circuits is harder to identify and that the relevant external terminals are even harder to identify.

Of course, swapping may be combined with the addition of loops, bypasses and logic gates to the scan chain. Use of some form of time dependently active logic gates and/or an LFSR structure is particularly advantageous since it will perturb any test pattern that may be applied to probe for the scan chains. Although two input two output swapping circuits have been shown, alternatively n-input n-output swapping circuits (e.g. cross-bar switches), with "n" an integer greater than two may be used, so that different swaps can be realized at different times, or more complicated permutations of the connections than swapping can be realized, making it even more difficult to identify the scan chains. Although the figure suggests placing swapping circuits at corresponding positions in the different scan chains (inputs connected to the mth scan flip-flop of both chains) this is not necessary.

Swapping may also be combined with the authorization control circuit of is FIG. 6, so that bits are swapped between the second shift register and one or more scan chains.

It should be noted that in addition to the disclosed modifications to the scan chain another security mechanism can be used to prevent secret information to be loaded into any scan chain and/or shifted through that scan chain unless authorization is provided. Thus, the proposed measures serve to make it difficult to determine the connections to the scan chain(s) unless authorizing information is available. Alternatively, the disclosed modifications may be used by themselves to prevent access to and/or identification of the secret information. In this case no separate security mechanism is provided to prevent secret information to be loaded or shifted.

The disclosed modifications to the scan chain may be used to make it more difficult to decide whether an appropriate key has been provided or whether the appropriate fuses and/or anti-fuses have been restored. Conversely the presence of the appropriate combination of fuses and/or anti-fuses may be used to disable the modifications to the scan chain, or to set them to a predetermined configuration that allows systematic access to test data.

The invention claimed is:

1. An integrated circuit comprising:
external terminals,
a functional circuit,
a test access circuit comprising a scan chain with parallel inputs and outputs coupled to the functional circuit, the scan chain furthermore being coupled between serial inputs and outputs coupled to the external terminals, the scan chain comprising a scan cell,
a scan chain modifying circuit coupled to the scan chain, the scan chain modifying circuit being configured and arranged to effect differences between numbers of times that temporally successive parts of test data traverse the scan cell on their journey through the scan chain during shifting in a direction between the external terminals, in response to signals that clock shifting of the test data through the scan chain, and being further configured and arranged to pass a part of the test data to traverse the scan cell more often than another part of the test data while both parts of the test data are shifted through the scan chain.

2. An integrated circuit according to claim 1, wherein the scan chain modifying circuit comprises:
a multiplexing circuit with an output coupled to an input of the scan cell, a control input and signal inputs coupled to a first further scan cell that precedes the scan cell, in the scan chain and an output of the scan cell or of a second further scan cell that follows the scan cell in the scan chain;
a time dependent signal generator circuit having an output coupled to the control input of the multiplexing circuit.

3. An integrated circuit according to claim 1, wherein the scan chain modifying circuit comprises:
a multiplexing circuit with a control input, a signal output coupled to a first further scan cell that follows the scan cell in the scan chain, and signal inputs coupled to an output of the scan cell and an output of a second further scan cell that precedes the scan cell in the scan chain;
a time dependent signal generator circuit having an output coupled to the control input of the multiplexing circuit.

4. An integrated circuit according to claim 1, wherein the scan chain modifying circuit comprises:
a switching circuit with an input coupled to an output of the scan cell, a control input and a plurality of outputs each coupled to a respective one of the external terminals, directly or via one or more respective further scan cells, the switching circuit being arranged to forward the test data from the scan cell selectively to a selected one of the outputs, which is selected by a control signal from the control input;
a time dependent signal generator circuit having an output coupled to the control input of the switching circuit.

5. An integrated circuit comprising:
external terminals,
a functional circuit,
a test access circuit comprising a scan chain with parallel inputs and outputs coupled to the functional circuit, the scan chain furthermore being coupled between serial inputs and outputs coupled to the external terminals, the scan chain comprising a scan cell,
a scan chain modifying circuit coupled to the scan chain, the scan chain modifying circuit being arranged to effect differences between numbers of times that temporally successive parts of test data traverse the scan cell on their journey through the scan chain during shifting in a direction between the external terminals, in response to signals that clock shifting of the test data through the scan chain, wherein the scan chain modifying circuit comprises:
a switching circuit with an input coupled to an output of the scan cell, a control input and a plurality of outputs each coupled to a respective one of the external terminals, directly or via one or more respective further scan cells, the switching circuit being arranged to forward the test data from the scan cell selectively to a selected one of the outputs, which is selected by a control signal from the control input;

a time dependent signal generator circuit having an output coupled to the control input of the switching circuit;

a plurality of scan chains, including said scan chain, each scan chain having an input and output coupled between a respective pair of external terminals of the integrated circuit, wherein the switching circuit is arranged to effect a selectable permutation of connections between outputs of first parts of the plurality of scan chains to inputs of second parts of the scan chains, the permutation being selected under control of the time dependent signal generator circuit.

6. An integrated circuit according to claim 1, comprising:
a time dependent signal generator circuit with an output for supplying a time dependent signal;
a logic circuit with inputs coupled to the output of the time dependent signal generator circuit and an output of a first part of the scan chain, the logic circuit having an output coupled to an input of a second part of the scan chain, for applying a combinatorial logic function of the time dependent signal and test signals from the first part of the scan chain to the second part of the scan chain.

7. An integrated circuit according to claim 6, comprising a linear feedback shift register structure in a shift path through the second part of the scan chain.

8. An integrated circuit according to claim 1, comprising an access control circuit coupled to the scan chain modifying circuit, the access control circuit being arranged to disable the effectuation of said differences upon detection of disabling information.

9. An integrated circuit comprising:
external terminals,
a functional circuit,
a test access circuit comprising a scan chain with parallel inputs and outputs coupled to the functional circuit, the scan chain furthermore being coupled between serial inputs and outputs coupled to the external terminals, the scan chain comprising a scan cell,
a scan chain modifying circuit coupled to the scan chain, the scan chain modifying circuit being arranged to effect differences between numbers of times that temporally successive parts of test data traverse the scan cell on their journey through the scan chain during shifting in a direction between the external terminals, in response to signals that clock shifting of the test data through the scan chain, wherein the scan chain modifying circuit comprises:
a routing circuit coupled to the scan cell, for controllably providing alternative routes for shifting a test data path to or from the scan cell to one or more of the external terminals;
a time dependent signal generator circuit;
a first shift register with an input coupled to the time dependent signal generator circuit;
a second shift register with an input for receiving a key signal from outside the integrated circuit;
a comparator circuit with inputs coupled to outputs of corresponding stages of the first shift register and the second shift register and an output coupled to a control input of the routing circuit.

10. An integrated circuit according to claim 1, comprising:
a plurality of routing circuits coupled to respective scan cells of the scan chain for controllably providing alternative routes for shifting a test data path to or from the respective scan cell to one or more of the external terminals;
a time dependent signal generator circuit;
a first shift register with an input coupled to the time dependent signal generator circuit;
a second shift register with an input for receiving a key signal from outside the integrated circuit;
plurality of comparator circuits, each having inputs coupled to outputs of a respective pair of corresponding stages of the first shift register and the second shift register and an output coupled to a control input of a respective one of the routing circuits.

11. An integrated circuit according to claim 1, wherein the scan chain modifying circuit comprises:
a transfer enable circuit coupled in the scan chain, for controllably altering between an enable mode and a disable mode for shifting of test signals to or from an external terminal;
a time dependent signal generator circuit;
a first shift register with an input coupled to the time dependent signal generator circuit;
a second shift register with an input for receiving a key signal from outside the integrated circuit;
a comparator circuit with inputs coupled to outputs of corresponding stages of the first shift register and the second shift register and an output coupled to a control input of the transfer enable circuit.

12. An integrated circuit according to claim 1, comprising:
a functional circuit enable circuit coupled to the functional circuit, for controllably altering between an enable mode and a disable mode for operation of the functional circuit;
a time dependent signal generator circuit;
a first shift register with an input coupled to the time dependent signal generator circuit;
a second shift register with an input for receiving a key signal from outside the integrated circuit;
a comparator circuit with inputs coupled to outputs of corresponding stages of the first shift register and the second shift register and an output coupled to a control input of the functional circuit enable circuit.

13. An integrated circuit comprising:
external terminals,
a functional circuit,
a test access circuit comprising a scan chain with parallel inputs and outputs coupled to the functional circuit, the scan chain furthermore being coupled between serial inputs and outputs coupled to the external terminals;
a transfer enable circuit configured and arranged in the scan chain, for controllably altering between an enable mode and a disable mode for shifting of test signals to or from at least one of the external terminals;
a clock terminal coupled to the scan chain, for clocking shifting of test data;
a time dependent signal generator circuit configured and arranged to operate in response to the clock terminal;
a first shift register with an input coupled to the time dependent signal generator circuit;
a second shift register with an input for receiving a key signal from outside the integrated circuit;
a comparator circuit with inputs coupled to outputs of corresponding stages of the first shift register and the second shift register and an output coupled to a control input of the transfer enable circuit.

14. An integrated circuit comprising:
external terminals,
a functional circuit,
registers with inputs and outputs coupled in parallel to the functional circuit;
a clock terminal coupled to the registers, for clocking updates of data in the registers;
a functional circuit enable circuit coupled to the functional circuit, for controllably altering between an enable operation and a disable operation of the functional circuit;
a time dependent signal generator circuit arranged to operate in response to the clock terminal;
a first shift register with an input coupled to the time dependent signal generator circuit;
a second shift register with an input for receiving a key signal from outside the integrated circuit;
a comparator circuit with inputs coupled to outputs of corresponding stages of the first shift register and the second shift register and an output coupled to a control input of the functional circuit enable circuit.

15. A method of testing an integrated circuit, the method comprising:
shifting test data though a scan chain under control of a test clock signal;
supplying key data to the integrated circuit under control of the test clock signal while the test data is being shifted;
performing a running verification of the key data in the integrated circuit while the test data is being shifted and
disabling or disturbing shifting of the test data after deviation from a required key has been detected.

16. A method of testing an integrated circuit according to claim 15, wherein the running verification proceeds from before capture of a test response until after capture of the test response.

* * * * *